United States Patent
Hicks et al.

(10) Patent No.: US 10,949,647 B2
(45) Date of Patent: Mar. 16, 2021

(54) SYSTEM AND METHOD OF EFFICIENT ILLUMINATOR-SENSOR SYNCHRONIZATION TO CAPTURE IMAGES

(71) Applicant: Intel Corporation, Santa Clara, CA (US)

(72) Inventors: Richmond Hicks, Aloha, OR (US); Khaled Ahmed, Anaheim, CA (US); Haibo Zhang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 272 days.

(21) Appl. No.: 15/808,868

(22) Filed: Nov. 9, 2017

(65) Prior Publication Data

US 2018/0131880 A1     May 10, 2018

Related U.S. Application Data

(60) Provisional application No. 62/420,448, filed on Nov. 10, 2016.

(51) Int. Cl.
*H04N 5/33* (2006.01)
*H04N 5/58* (2006.01)
(Continued)

(52) U.S. Cl.
CPC ..... *G06K 9/00228* (2013.01); *G06K 9/00255* (2013.01); *G06K 9/2036* (2013.01);
(Continued)

(58) Field of Classification Search
CPC ........... G06K 9/00228; G06K 9/00255; G06K 9/2036; G06K 9/4661; H01S 5/02296;
(Continued)

(56) References Cited

U.S. PATENT DOCUMENTS

2010/0069727 A1    3/2010  Kawano et al.
2010/0304854 A1*  12/2010  McEldowney ...... G06K 9/2027
                                                                        463/30

(Continued)

OTHER PUBLICATIONS

Office Action for U.S. Appl. No. 15/807,953, notified Nov. 29, 2018.
(Continued)

*Primary Examiner* — Joon Kwon
(74) *Attorney, Agent, or Firm* — Green, Howard & Mughal LLP.

(57) ABSTRACT

A method, system, and article of efficient illuminator and camera sensor synchronization to capture images comprises generating a sequence of frames each associated with a captured image and comprising operating an electronic shutter using vertical-blanks (vblanks) occurring between the last reset of a previous frame and a first read of a current frame consecutively after the previous frame of the sequence of frames. The generating also comprises receiving, by at least one camera sensor, from at least one infra-red-related illuminator and limited to a time within or equal to the vblanks so that the illuminator is turned on and off at the same vblank, and sensing the received light at the camera sensor to convert the light into image data to form the frames in the sequence of frames.

21 Claims, 9 Drawing Sheets

(51) Int. Cl.

| | | |
|---|---|---|
| *G06K 9/00* | (2006.01) | |
| *G06K 9/46* | (2006.01) | |
| *H01S 5/026* | (2006.01) | |
| *H01S 5/42* | (2006.01) | |
| *G06K 9/20* | (2006.01) | |
| *H01S 5/183* | (2006.01) | |
| *H01S 5/40* | (2006.01) | |
| *H01S 5/022* | (2006.01) | |

(52) U.S. Cl.
CPC .......... *G06K 9/4661* (2013.01); *H01S 5/026* (2013.01); *H01S 5/18386* (2013.01); *H01S 5/426* (2013.01); *H04N 5/33* (2013.01); *H04N 5/58* (2013.01); *H01S 5/02296* (2013.01); *H01S 5/4087* (2013.01); *H01S 5/423* (2013.01)

(58) Field of Classification Search
CPC .... H01S 5/026; H01S 5/18386; H01S 5/4087; H01S 5/423; H01S 5/426; H04N 5/33; H04N 5/58
See application file for complete search history.

(56) References Cited

U.S. PATENT DOCUMENTS

| | | | |
|---|---|---|---|
| 2011/0228096 A1* | 9/2011 | Friel | H04N 5/33 348/164 |
| 2011/0317130 A1 | 12/2011 | Gollier | |
| 2013/0194787 A1 | 8/2013 | Geske et al. | |
| 2013/0201347 A1 | 8/2013 | Coulon et al. | |
| 2014/0376220 A1 | 12/2014 | Shen et al. | |
| 2015/0130903 A1 | 5/2015 | Thompson et al. | |
| 2016/0373728 A1* | 12/2016 | Cho | H04N 5/2351 |
| 2017/0082263 A1 | 3/2017 | Byrnes et al. | |
| 2018/0006431 A1* | 1/2018 | Winer | G06T 7/50 |
| 2018/0129866 A1 | 5/2018 | Hicks et al. | |
| 2018/0275321 A1 | 9/2018 | Kamali et al. | |
| 2019/0386749 A1 | 12/2019 | Lezec et al. | |

OTHER PUBLICATIONS

Arbabi, et al., "Dielectric metasurfaces for complete control of phase and polarization with subwavelength spatial resolution and high transmission", Nature Nanotechnology; DOI: 10.1038/NNANO. 2015.186; Aug. 31, 2015.

Chang, et al., "Algorithm based on rigorous coupled-wave analysis for diffractive optical element design", Journal of the Optical Society of America A; vol. 18, Issue 10; pp. 2491-2501; 2001.

Gerchberg, et al., "A practical algorithm for the determination of phase from image and diffraction plane pictures", Optik 35, pp. 227-246; 1972.

Gu, B. et al., "General theory for performing an optical transform", Applied Optics; vol. 25, No. 18, Sep. 15, 1986.

Leshin, J. et al., "Lithographic VCSEL Array Mulitmode and Single Mode Sources for Sensing and 3D Imaging", Proc. of SPIE; vol. 9854, 9854Y, 2016.

Yang, et al., "Gerchberg-Saxton and Yang-Gu algorithms for phase retrieval in a nonunitary transform system: a comparison", Applied Optics; vol. 33, No. 2; pp. 209-218; Jan. 10, 1994.

Yang, G. et al., "On the amplitude-phase retrieval problem in the optical system", Acta Phys. Sin. 30; pp. 410-413; 1981. English Abstract Only.

MAX3735A Laser Driver Output Configurations, Part 4: Driving VCSELs, Design Note: HFDN-26.3; Rev.1; Apr. 2008; 8 pages.

Beatty "Lasers: What is Coherent Light?", downloaded on Jan. 31, 2018 from http://amasci.com/miscon/coherenc.html, 2004.

Yu, N. et al. "Flat optics with designer metasurfaces", PUBD Online: Jan. 23, 2014 | DOI: 10.1038/NMAT3839; Nature Materials, vol. 13, Feb. 2014, 12 pages.

Final Office Action for U.S. Appl. No. 15/793,795, notified Jun. 28, 2019.

Notice of Allowance for U.S. Appl. No. 15/807,953, dated Mar. 20, 2019.

Office Action for U.S. Appl. No. 15/793,795, notified Mar. 8, 2019.

Non-Final Office Action for U.S. Appl. No. 16/129,624, notified May 14, 2020.

Final Office Action for U.S. Appl. No. 16/129,624 dated Nov. 24, 2020.

\* cited by examiner

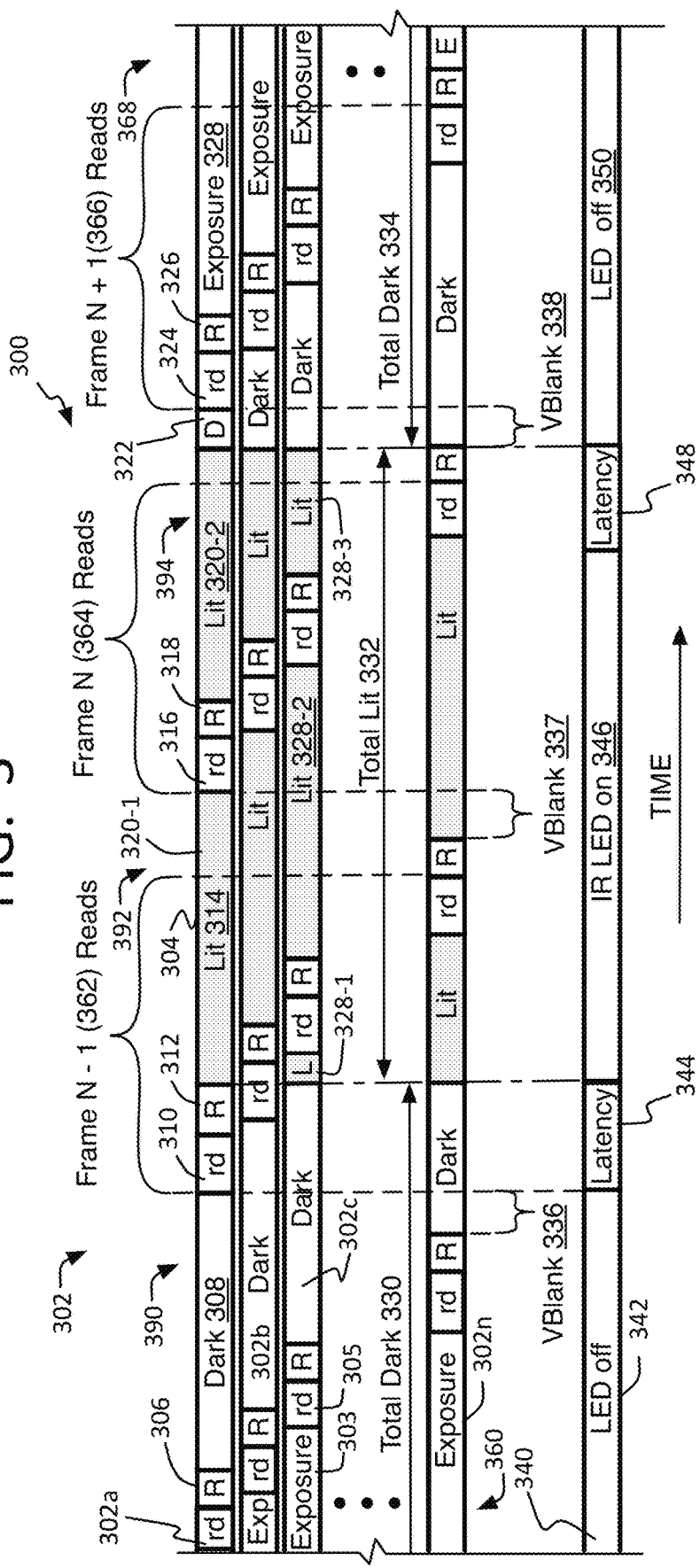

GENERATE A SEQUENCE OF FRAMES EACH ASSOCAITED WITH A CAPTURED IMAGE
402

OPERATE AN ELECTRONIC SHUTTER USING VERTICAL-BLANKS (VBLANKS) OCCURRING BETWEEN THE LAST RESET OF A PREVIOUS FRAME AND A FIRST READ OF A CURRENT FRAME CONSECUTIVELY AFTER THE PREVIOUS FRAME OF THE SEQUENCE OF FRAMES
404

RECEIVE, BY AT LEAST ONE CAMERA SENSOR, LIGHT FROM AT LEAST ONE INFRA-RED-RELATED ILLUMINATOR AND LIMITED TO A TIME WITHIN OR EQUAL TO THE VBLANKS SO THAT THE ILLUMINATOR IS TURNED ON AND OFF AT THE SAME VBLANK
406

SENSE THE RECEIVED LIGHT AT THE CAMERA SENSOR TO CONVERT THE LIGHT INTO IMAGE DATA TO FORM THE FRAMES IN THE SEQUENCE OF FRAMES
408

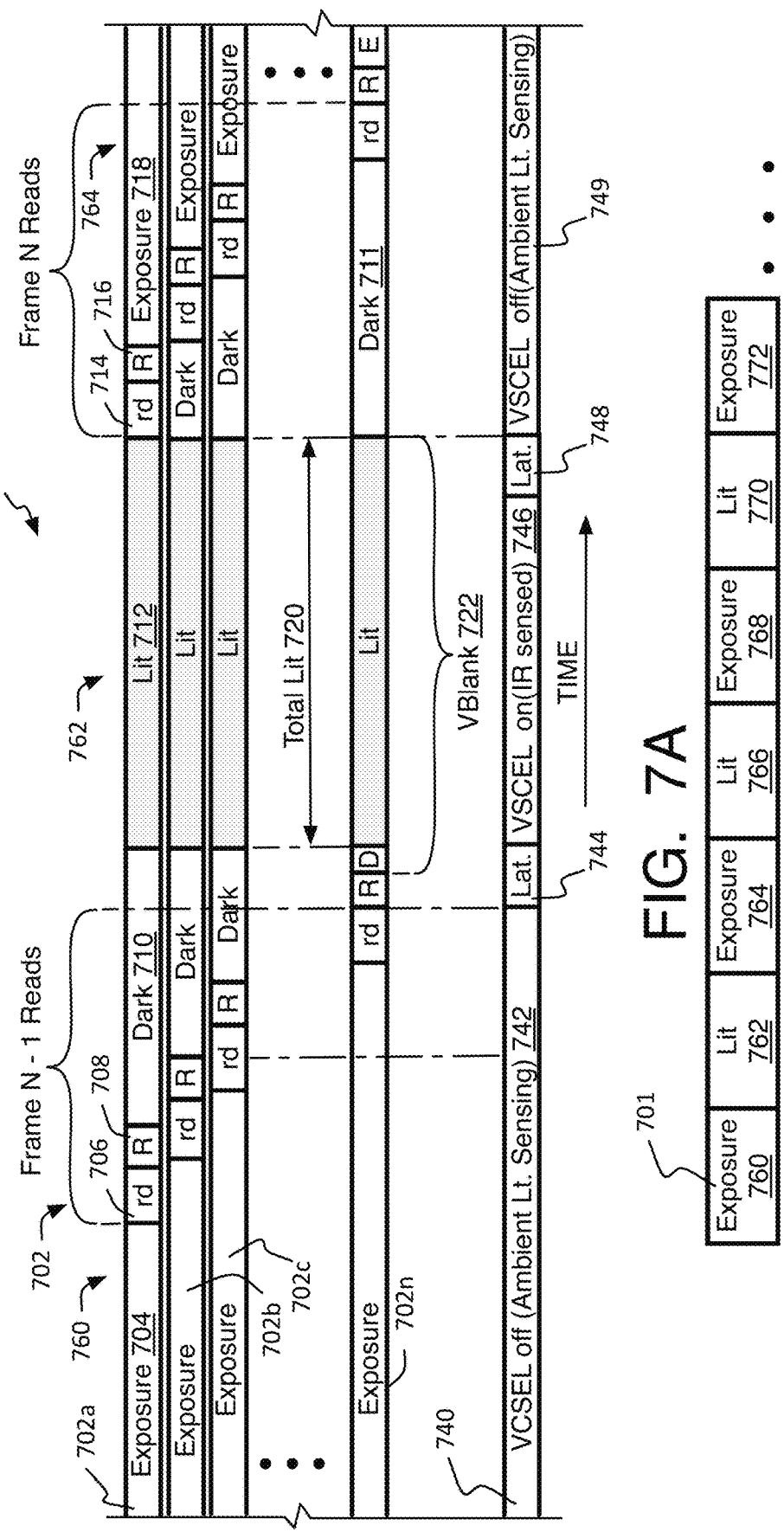

GENERATE A SEQUENCE OF FRAMES EACH ASSOCAITED WITH A CAPTURED IMAGE
802

OPERATE AN ELECTRONIC SHUTTER USING VERTICAL-BLANKS (VBLANKS) OCCURRING BETWEEN THE LAST RESET OF A PREVIOUS FRAME AND A FIRST READ OF A CURRENT FRAME CONSECUTIVELY AFTER THE PREVIOUS FRAME OF THE SEQUENCE OF FRAMES
804

OBTAIN A SENSOR SYNC SIGNAL
806

DETERMINE SYNCHRONIZATION BETWEEN THE SYNC SIGNAL AND AT LEAST WHEN AN ILLUMINATOR SHOULD BE TURNED ON TO PROVIDE LIGHT TO THE SENSOR WITHIN THE VBLANKS
808

CONTROL THE ILLUMINATOR TO LIGHT ACCORDING TO THE SYNCHRONIZATION
810

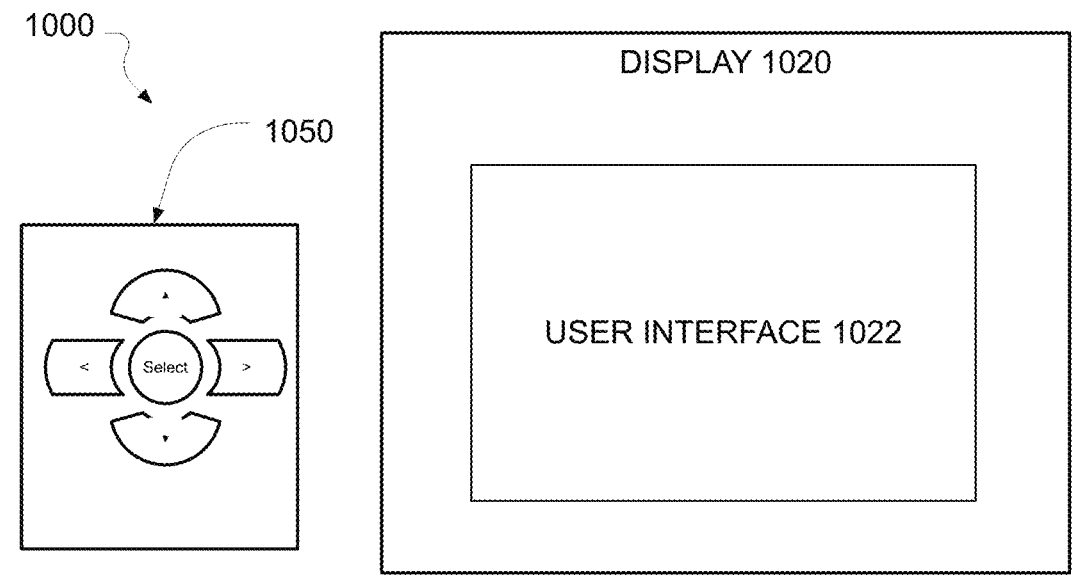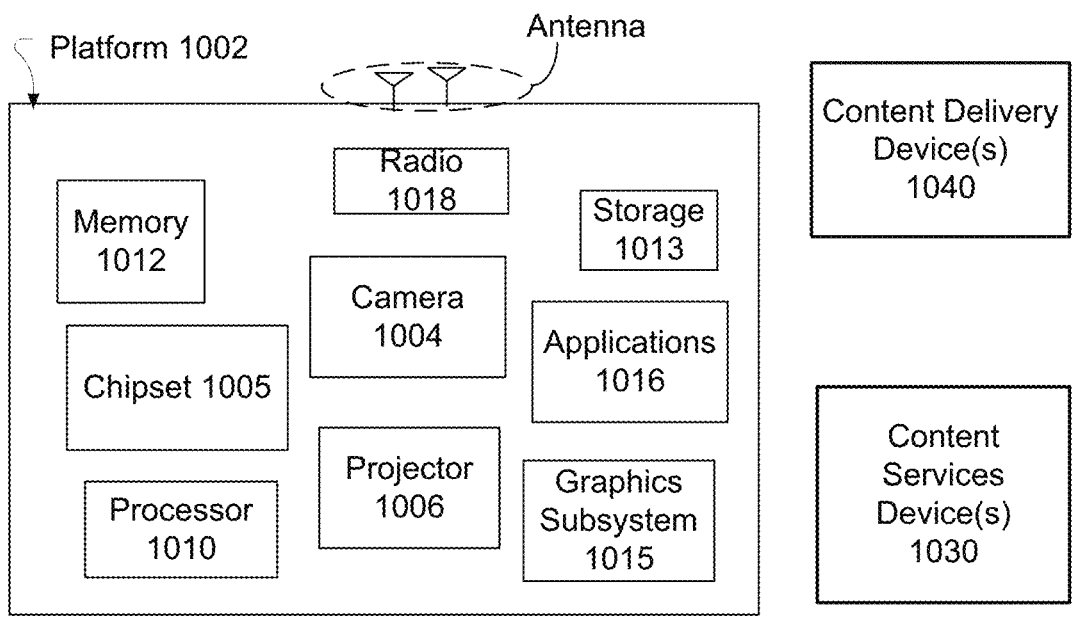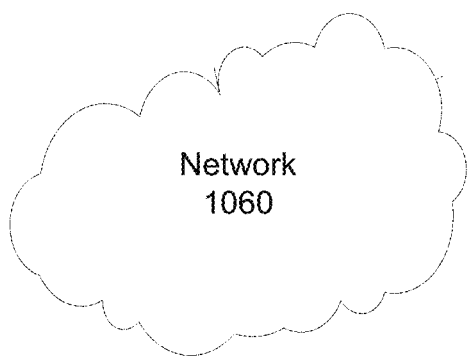
FIG. 10

SYSTEM AND METHOD OF EFFICIENT ILLUMINATOR-SENSOR SYNCHRONIZATION TO CAPTURE IMAGES

CROSS-REFERENCE TO RELATED APPLICATION

This application claims the benefit of U.S. Provisional Patent Application No. 62/420,448, filed Nov. 10, 2016, and titled INFRARED ILLUMINATORS, CAMERAS, AND BIOMETRIC DETECTION AND LOGIN SYSTEMS, and which is fully incorporated herein for all purposes.

BACKGROUND

Projectors or illuminators for digital cameras are often used to project infra-red (IR) light (about 700 to 1000 nm wavelength for near-infra-red (NIR)) into a space and then use a camera sensor to detect the light reflecting from objects in the space in order to form images of the objects. Such IR or NIR system may use the images for many different applications including biometric face detection for security authorization purposes, eye tracking and other object detection operations such as with motion detection related-games or artificial intelligence (AI), computer vision, and so forth. In these systems, the sensed reflections from the NIR illuminator are used to form an IR or NIR image with specific characteristics needed to perform the desired detection or to use the image for other applications. Note that the terms image, frame, and picture all refer to the same thing and may be used interchangeably herein.

The conventional light source on an IR illuminator is an LED on many devices. A difficulty occurs when ambient light sensed at the sensor significantly mixes with or washes out the LED light resulting in erroneous results and inaccurate or unclear images. While band pass filters may be used to filter out the ambient light, some sources of ambient light have enough in-band power to compete with the LED signal. One ambient-light cancelling technique to avoid this result uses frame subtraction. Frame subtraction involves pulsing a near-infrared LED on during one camera frame period and off during another frame period. When the LED is on, the sensor senses both the LED light and the ambient light, and when the LED is off, the sensor senses only ambient light. The camera output is then digitized so that the pixel values of the ambient-only frame can be subtracted from the pixel values of the signal-plus-ambient frame to obtain signal-only pixel values. This provides a more robust image processing algorithm with increased image quality and accuracy. The two frames are referred to as frame pairs and are often generated as alternating dark (unlit) and light (lit) frames.

A difficulty arises to generate the frame pairs, however, because an LED typically needs to light an entire frame with increased light intensity to provide a frame sufficiently brighter than the ambient-only frame to provide an adequate minimum signal-to-noise ratio (SNR) for the subtracted frame. The challenge is magnified when the system employs a rolling shutter image which is preferred due to cost and size constraints. A rolling shutter imager stages the exposure of each line to end at the time it will be read out meaning that each line of the image is exposed at a different time. The illuminator must be active for the entire frame from a first row reset to a last row read out of a rolling shutter imager so that all rows are uniformly illuminated.

Such a requirement to light (and darken) an entire frame is undesirable when a rolling shutter is being used. Specifically, the LEDs are alternatingly turned on and off at the time of every other vertical-blank (vblank), which is the time between the reads of consecutive frames. Due to the overlapping configuration of the row-by-row exposure of a rolling shutter, this results in frames that are partially unlit and partially lit between each alternating frame that is entirely lit and entirely unlit. Such frames that are partially lit when the frame needs to be entirely dark cannot be used for frame subtraction since it still combines short undesirable durations of the IR light with ambient light. Thus, these partially lit frames are considered to be unusable and corrupt. This results in wasted IR energy in the form of light collected by those partially lit frames, and the lit target frame has less energy than it could have. It also results in the need to double the frame rate since half of the frames are unusable. This increase in framerate causes greater power consumption for the illuminator since so much energy is wasted on discarded frames and on the sensor since the sensor must be read out more often. A lower SNR also results since only half the illumination energy is captured by the desired frame. The higher framerate also reduces the color image quality due to the smaller exposure times, especially in low light. While increasing power to the illuminator may raise the IR energy to the target frame, this increases the power consumption of the illuminator resulting in thermal and battery life challenges.

DESCRIPTION OF THE FIGURES

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 3 is a rolling shutter sequence diagram showing synchronization between an LED illuminator and camera sensor operations;

FIG. 3A is a conventional frame sequence for frame subtraction;

FIG. 4 is a flow chart of a method of illuminator-sensor synchronization for capturing images in accordance with at least one of the implementations herein;

FIG. 7 is a rolling shutter sequence diagram showing synchronization between a VCSEL illuminator and camera sensor operations;

FIG. 7A is a frame sequence for frame subtraction in accordance with at least one of the implementations herein;

FIG. 8 is a detailed flow chart of a method of illuminator-sensor synchronization for capturing images in accordance with at least one of the implementations herein;

FIG. 10 is an illustrative diagram of an example system; and

DETAILED DESCRIPTION

Figure 1:
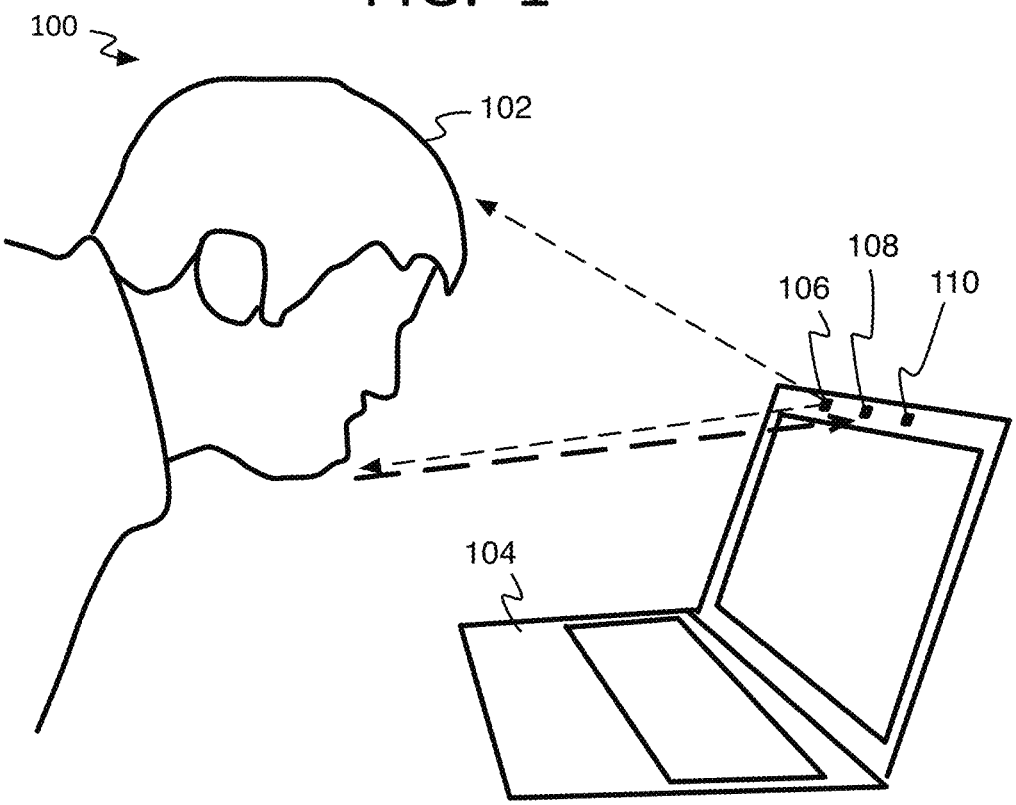
FIG. 1 is an illustration of a user using an electronic device with a light projection and image capturing system.

One or more implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, cameras, laptop computers, tablets, and so forth, as well as dedicated access authorization devices either for access to an electronic device or otherwise mounted or placed at a variety of physical locations may implement the techniques and/or arrangements described herein. Further, while the following description may set forth numerous specific details such as logic implementations, types and interrelationships of system components, logic partitioning/integration choices, and so forth, claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (for example, a computing device). For example, a machine-readable medium may include read-only memory (ROM); random access memory (RAM); magnetic disk storage media; optical storage media; flash memory devices; electrical, optical, acoustical or other forms of propagated signals (e.g., carrier waves, infrared signals, digital signals, and so forth), and others. In another form, a non-transitory article, such as a non-transitory computer readable medium, may be used with any of the examples mentioned above or other examples except that it does not include a transitory signal per se. It does include those elements other than a signal per se that may hold data temporarily in a "transitory" fashion such as RAM and so forth.

References in the specification to "one implementation", "an implementation", "an example implementation", and so forth, indicate that the implementation described may include a particular feature, structure, or characteristic, but every implementation may not necessarily include the particular feature, structure, or characteristic. Moreover, such phrases are not necessarily referring to the same implementation. Further, when a particular feature, structure, or characteristic is described in connection with an implementation, it is submitted that it is within the knowledge of one skilled in the art to effect such feature, structure, or characteristic in connection with other implementations whether or not explicitly described herein.

A system and method of efficient illuminator-sensor synchronization to capture images.

As mentioned, an infra-red (IR) illuminator may be used for biometric detection or other applications. For example, such biometric detection may be related to face recognition or iris illuminators and IR imaging systems including face login and other near infrared (NIR) centric techniques, usages, devices, and the like. Such techniques, usages, devices, and the like may require controlled NIR illumination to generate an image with the specific characteristics needed for face recognition or other usages.

Referring to FIG. 1, an example face login system 100 is shown where a user 102 faces an access authorization device 104, which in this example may be a computer or laptop with an IR illuminator (or projector) 106, and a camera or sensor 108 that detects light projected from the IR illuminator and reflecting from an object 102 to be detected such as the user's face. The sensor may be a hybrid RGB-IR sensor to provide both color and IR images. Otherwise, a separate RGB sensor 110 may provide the color images. Such an arrangement conventionally is performed by using an LED illuminator emitting NIR light.

Figure 2:
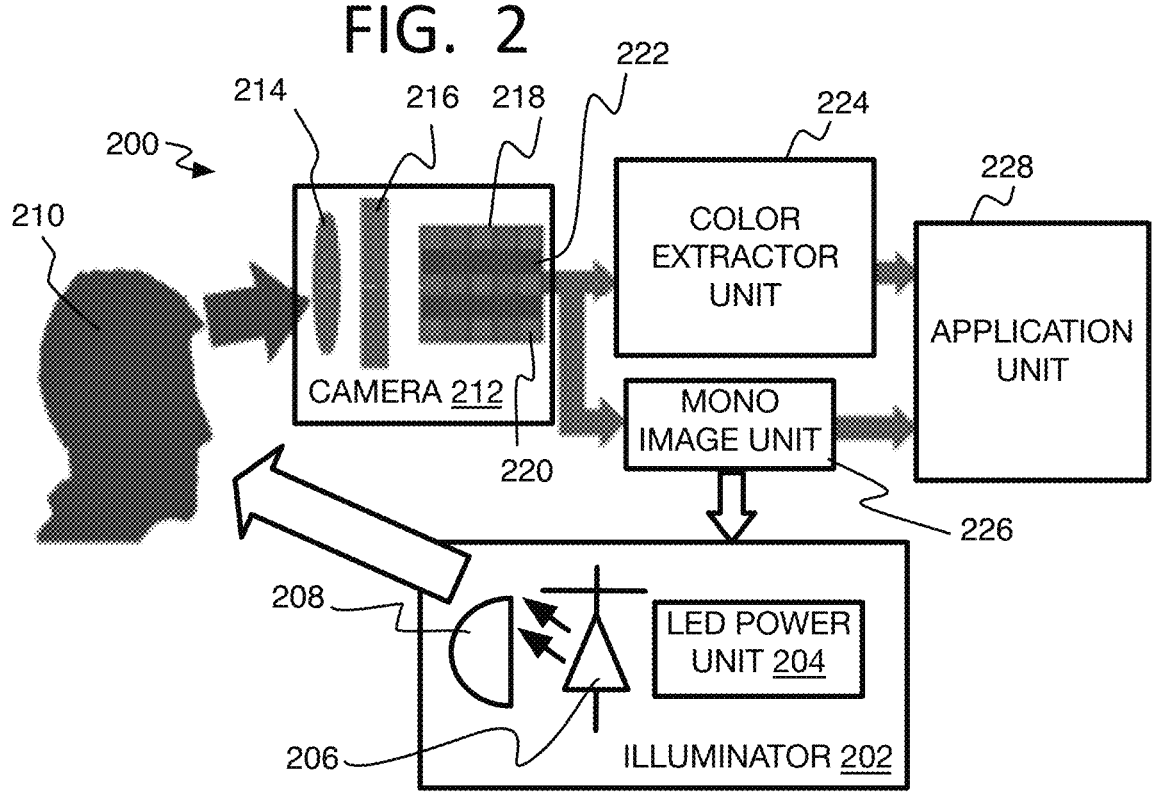
FIG. 2 is a schematic diagram of a conventional LED IR light projection and image capture and processing system.

Referring to FIG. 2, an example conventional LED IR projection and image capture system 200 (or just image processing system) has an LED illuminator 202 that is emitting light onto an object 210, which may be a face for facial recognition or many other object detection targets. The illuminator 202 may have a LED power unit 204 that turns on and off the power to one or more LED diodes 206, and according to a timing sequence described in detail below. A lens 208 may be provided over the LED die to narrow the beam and/or to make a side-emission pattern and to emit light in a Lambertian or other desired pattern, such as a batwing pattern, that may be shaped for a particular application. Such a lens for a surface mounted LED may be pre-formed molded plastic (e.g. silicone), which is bonded to a package in which the LED die is mounted. A face login device may use an LED with a refractive element to focus the light onto the target, such as with the example illuminator 202.

A camera or imaging device 212 may have imaging optics that receive the light emitted from the LED illuminator 202 and reflected from the object 204, and may include a lens 214 and an optical filter 216. The lens 214 may provide a light reception pattern, while the optical filter 216 may limit the spectral response of the camera. A sensor 218, which may be for monochromatic light such as IR or may be for hybrid combined RGB-IR light sensing, may have an array of light sensitive diodes corresponding to pixel locations on the sensor. In the present example, a hybrid sensor is shown in Bayer pattern with some pixel locations 220 reserved for sensing visible color light, while other pixel locations 222 may be reserved for sensing the non-color (and here IR or NIR) light. The IR sensor pixel locations 222 are shown to be arranged in the same row, but many other patterns may be used on a hybrid RGB-IR sensor. The sensor may be a complementary metal-oxide semiconductor (CMOS) sensor to name one example.

Whether or not considered to be part of the camera 212 or separate, the system 200 may have a color extraction unit 224 and mono (or monochromatic) image unit 226. The color extraction unit 224 may receive signals from the sensor and may convert those signals into raw digital image data if not do so already by the sensor itself. The color extraction unit 224 then may or may not perform certain pre-processing, such as demosaicing, and/or statistics gathering to the raw image data before passing the data onto one or more application units 228 to use the image data for various reasons whether to display the images or analyze the images such as for object detection or depth mapping.

The mono image unit 226 may extract the signals from the reserved non-color pixel locations, and digitize the signals when not done so already by the sensor, to provide raw image data, with and/or without pre-processing and/or statistics gathering. The image data then may be passed to one or more application units 228 to use the images for object detection such as facial recognition, iris scanning, and/or eye tracking as well as depth mapping and/or display to name a few examples, but is not limited to any one specific application. The mono image unit 226 also may provide the illuminator with synchronization indicators or instructions to control the timing of the illumination of the LED in order to sync the shutter of the camera with the illumination of the LED.

A number of disadvantages exist relating to the synchronization of the LED light received at the sensors and the timing of the camera's electronic rolling shutter. This is best explained with a description of a conventional electronic rolling shutter. A rolling shutter is a method of capturing an image that does not collect light with the entire sensor simultaneously, but rather different parts of the sensor generate photocharge at different points in time. The shutter roll may be column-based where columns of sensor pixels read out in sequence from left to right (or right to left) of a 2D sensor array. The shutter roll may be row-based, as in the present examples, where rows of sensor pixels read out in sequence from top to bottom (or bottom to top) of the 2D sensor array. With a rolling shutter, the image sensor collects light from only a portion of a sensor field of view (FOV) at any given instant in time rather than collecting the entire frame of image data at the same instant in time, which is often referred to as a "global shutter." With a rolling shutter, one scene is collected as an image frame only after sufficient time increments have passed to roll through all portions of the sensor that are consecutively reset, allowed to integrate charge in response to light exposure, and then read out. This duration is referred to as the frame time, and these frame times overlap such that the exposure or other treatment of upper rows on a next frame may begin while light is still being collected and read for lower frames of a previous frame.

The LED illuminator here emits light, which may or may not be in a predetermined pattern, over an entire scene simultaneously (or scans over the scene in any unsynchronized manner) and would do so for the entire time required for an image sensor to collect a full image frame. Such a projection technique favors the use of a global shutter in which all pixels of a sensor array actively sample the illuminated scene concurrently, thereby minimizing the "on-time" of the illuminator light source. A global shutter, however, significantly increases the size and cost of a camera module relative to architectures employing a rolling shutter. An illuminator that casts light over an entire scene simultaneously is relatively inefficient for a rolling shutter camera module because power is wasted to illuminate portions of the scene not concurrently sampled by the sensor both within a current frame that is lit and is being analyzed as well as adjacent frames that should be dark. This inefficiency becomes greater as sensor pixel integration time decreases and the number of lines (e.g., rows) of a sensor array integrating at any given time instant decreases.

Referring to FIGS. 3 and 3A, an image capturing or processing system 300 is demonstrated on a time-line chart where time runs from left to right, and includes the operation or timing sequence 302 of at least one camera or image sensor synchronized to the operations or shutter timing sequence 340 of an LED illuminator. The operations performed here may be for a separate IR sensor or a hybrid RGB-IR sensor. The image sensor may be controlled to operate a rolling shutter or electronic focal plane shutter process where the pixels are reset for photocharge in a line-sequential (line-by-line) fashion, and read out in a line-sequential fashion for an entire frame. In this type of system, the exposure times from row to row may overlap and need not be performed at the same time. The time between any of the row resets (R) and the row read-out (rd) time shown along the same row, such as by one example between reset (R) 312 and the row read-out (rd) time 316, is the integration time or exposure time (exposure) 304, which is the time allotted for accumulating photocharge in one or more rows of pixels on a frame (or picture or image) or even just part of a row. The length of the integration 304 may vary depending on how many rows or pixels are covered by the integration, and by varying the amount of delay between the reset and corresponding readout. The row read-out measures the amount of photocharge in the row since the last reset which initiated the integration time.

Although not shown, the readout 316 may be separated from the next row reset 318 in the same row by a horizontal or line blanking space (not shown for simplicity) and an adjustment or reserved time block (also not shown for simplicity). Typically horizontal or line blanking may be used to provide a component (such as an ISP) sufficient time to handle incoming data. The reserved time block may be used after the horizontal blank and before the next reset of the same row to limit or prevent any overlap of readout periods.

The resets 312 are performed one at a time down the frame, row by row, so that here, each diagonal column 390, 392, and 394 of integration rows 302a to 302n corresponds to a frame N−1 (360), N (362), or N+1 (364). Since the resets 312 are offset in time, when the exposure time 304 is the same or similar throughout a single frame, a diagonal column is formed with uniform steps. Regardless of the length of the integration 304 and position of the resets 312, the read outs 316 are timed so that the read outs will be performed one at a time for each integration row down the frame N (364) for example, forming a diagonal line of read outs 316 with uniform, or close to uniform, steps as shown.

The integration periods 314 are labeled depending on the state of the illuminator and the light that is being collected. Thus, an integration period labeled "exposure" has the LED off and is collecting ambient light. This may be performed to generate the entirely dark frame to form a frame pair for frame subtraction. This "exposure" time period also may be used to collect visible color light on an RGB-IR so that the system may operate in dimly lit environments. The label "dark" refers to areas of integration where the LED is off and the sensor pixels may be collecting ambient light, and here shown on a corrupted frame that is partially dark and partially lit, where the light signal readings are discarded.

The label "lit" is used whenever the LED is on no matter which frame an integration period is located.

The time period (Frame N Reads) for capturing the brightness for a frame is measured from readout to readout and overlaps with the frame N−1 exposure of the next frame N+1. It will be understood, however, that the lengths of the integrations 304 may vary for a frame depending on the number or portion of lines covered by the integration. In this case, the location of the resets may not form a perfect diagonal line and may be much more staggered while the timing of the readouts are maintained so that the readouts may be performed in order, and one at a time as shown. Otherwise, the length of the exposure time may be limited by the length of the frame such that exposure time cannot be longer than the frame length. The start and end of a frame is marked by the position of vertical (frame) blanking (vblanks 336, 337, and 338) for example which is at the bottom of the diagonal column 426 after the last reset R to divide the frames.

Vertical or frame blanking is conventionally used to control the frame rate where the longer the vertical blanking, the slower the frame rate, the longer the maximum possible exposure time, and the more time to perform calculations before read-out of the next frame starts. Relevant here, the LED illuminator may be switched from off to on, or on to off, at the vblanks. In order to provide both entirely dark and light frames, the LED sequence 301 has the LED off 342 until the end of vblank 336. This occurs after the last or bottom read of row 302n of frame 360 and last reset clearing the photocharge of frame 360 to start collecting for next frame 362. The frame 360 formed by column 390 of integrations remains dark through a latency period 344 and until the end of the first reset 312 on the first row 302a of frame 362.

Then, the LED is on 346 forming lit periods 314. The LED is then turned off after a latency period 348 where the lit periods 314 remain lit until after the last read of frame N (364) on bottom row 302n and last reset for frame 366. The end of latency 348 is also the start of vblank 338. These lit periods extend over two or three frame integration periods on the same row and on different frames due to the overlapping arrangement of the frames. Thus for example, the lit period 314 on row 302a is formed by lit portion 320-1 on frame N (364) and lit portion 320-2 on frame N+1 (366), while the lit period 314 on row 302c is formed by lit portion 328-1 on frame N−1 (362), lit portion 328-2 on frame N (364), and lit portion 328-3 on frame N+1 (366). Such multiple portions forming the lit periods 314 may occur on only some of the rows or every row down to row 302n as shown.

Thereafter, the LED remains off 350, and the frame N+1 (366) is now corrupted since it has both lit periods 314 (for example lit portion 320-2) and dark periods 322. This also forms another total dark period 334 for frame N+2 (368) for the frame pair subtraction. With this arrangement then as shown on sequence 301, the IR digitized data determined from entirely dark (exposure) frame 360 may be subtracted from entirely lit frame 364, while entirely dark (exposure) frame 388 may be subtracted from a next entirely lit frame 372 (shown on the LED sequence 301 but not shown on the sensor sequence chart 302). Every other frame 362, 366, 370, and so on, must be discarded as corrupt.

As can be understood from this conventional arrangement of a rolling shutter and LED illumination, this arrangement results in at last two difficulties: (1) poor usage of the IR energy, and (2) poor performance under ambient illumination. First, since the LED is on for a full frame from first reset to last read (or in other words, during almost two full frame read periods of all rows) as shown on shutter sequence 302, IR energy is wasted on the previous and subsequent frame relative to the current lit frame since those frames are partially illuminated. The fact that IR energy goes unused is a waste of energy on its own, and may be about half of the IR energy transmitted. This results in greater power consumption by the illuminator to obtain a sufficient amount of IR energy on the entirely lit frame or accepting a less adequate amount of energy used on the entirely lit frame. This also results in more power consumption by the camera sensor consumed by running the sensors at a higher frame rate.

In addition, due to the corrupted or discarded transition frames, a frame subtraction operation that could obtain frame pairs at a framerate of 30 fps must use 60 fps for example (2× the required frame rate) to accommodate for the loss of the partially illuminated frames. This raises the interface bandwidth since more frames need to be transmitted compared to when no frames are lost. The higher frame rate also results in a lower signal-to-noise ratio (SNR) since more frames need to be generated in a shorter exposure time, which reduces the amount of desired signal that can be captured by a single frame. The higher framerate also reduces the color image quality due to the smaller exposure times, especially in low light.

When the lit (or target) frame does not have sufficient IR energy, and in turn light intensity, the images are of lower quality due to low SNR and interference by ambient light. Specifically, since the target frame being analyzed is merely receiving half the IR energy, this decreases the amount of ambient light that can be detected and removed while subtracting the ambient light introduces noise itself, further reducing the SNR.

To resolve these issues, a vertical-cavity surface emitting laser (VCSEL) based illuminator in conjunction with specialized timing of the illuminator and sensor may be provided to enable all or most illuminator energy to be captured in a single frame of a rolling shutter imager. A VCSEL has a number of advantages over an LED for this technology. For example, a VCSEL provides a much narrower wavelength emission, which enables a narrow bandpass filter and also improves ambient light rejection. It also provides better far field illumination control enabling lower power consumption. When combined with a metalayer to shape the radiation distribution pattern of the light intensity, a more uniform light intensity and SNR can be provided including near the corners of a resulting image. An array of such VCSELs may be provided on a single illuminator and may emit light in a controlled variation of wavelengths to reduce speckle.

In order to overcome the difficulties of power consumption and image quality due to the LED described above, and while operating either a separate IR or NIR sensor or a hybrid IR and color sensor (or RGB-IR sensor by one example), the VCSEL has sufficiently improved, increased, and concentrated light intensity and energy due to its fast response time and ability to operate at a higher peak current. This feature in addition to providing an extended vertical blanking period will enable a VCSEL to be operated with a high peak current pulse that is synchronized to the vertical blanking period. For example, the camera may operate with no lost (corrupted or discarded) frames at 30 fps, or now could be doubled to 60 fps to provide a higher quality video image on devices where such a framerate is the maximum framerate permitted. This may be accomplished by using power delivery circuitry capable of synchronizing to the image sensor by having an illuminator-sensor sync unit described herein for example.

The implementations discussed herein may enable two times more efficient illumination which increases the tolerance to ambient illumination by increasing the range of the ambient light wavelengths that can be detected and removed, two times longer exposure time which increases color image quality, and especially in low light, and increases the SNR on the IR image as well. Also, the use of the VCSEL synchronized with the vblanks as discussed may lower power consumption at both the illuminator and sensor, and lower interface bandwidth based on a lower frame rate.

Referring to FIG. 4, an example process 400 for illuminator-sensor synchronization to capture images, and for image processing, described herein is arranged in accordance with at least some implementations of the present disclosure. In the illustrated implementation, process 400 may include one or more operations, functions or actions as illustrated by one or more of operations 402 to 408 and numbered evenly. By way of non-limiting example, process 400 will be described herein with reference to any of the example image capturing or processing systems described herein and where relevant.

Process 400 may include "generate a sequence of frames each associated with a captured image" 402. This may include the use of an image capturing device, such as one or more cameras, whether a dedicated camera or multi-purpose device, and may include the generation of a frame of sequences that are monochromatic, such as with infra-red (IR) or near-infra-red (NIR) light. The image capture device may have one or more sensors with one or more light-sensitive diodes to collect the light. Optionally, the generating may include generating color images (such as RGB) either by a separate color sensor or by a hybrid RGB-IR sensor for example as already described herein.

Process 400 may include "operate an electronic shutter using vertical-blanks (vblanks) occurring between the last reset of a previous frame and a first read of a current frame consecutively after the previous frame of the sequence of frames" 404. In one example, a camera or image sensor uses a shutter sequence (or pattern or process) that may be an electronic rolling shutter as described above, and that includes vblanks that separate, from one frame to another frame, the series of resets (R) and read-outs (rd) in time of the multiple rows of the sensor. For a rolling shutter, the vblank is a duration from the end of the last reset that is clearing photocharge of the previous frame, usually on the bottom row of the sensor, and to the start of a first read-out, usually on the top row, of the next consecutive (or current) frame.

Process 400 also may include "receive, by at least one camera sensor, light from at least one infra-red-related illuminator and limited to a time within or equal to the vblanks so that the illuminator is turned on and off at the same vblank" 406, and particularly, where infra-red-related refers to near the wavelength range of infra-red, so that it includes NIR for example. As mentioned above, since the integration of some rows of the sensor, and in turn the resulting image, on one frame overlap in time with the integration on other adjacent frames, lighting these areas of the rows also wastes IR energy on those adjacent frames and reduces the energy on the current frame. In order to avoid this then, the illuminator may be turned on and off during the vblanks between the frames. In order to provide sufficient energy, the vblanks may be extended, and by one form, up to about 17 msec when using a frame rate of about 30 fps (with 17 msec of blanking and 17 msec of readout, as an example). A large number of possible alternative solutions exists that balance the speed of readout against the peak power of the illuminator. In order to provide a sufficient amount of energy and light intensity within that time, a VCSEL light source with one or more VCSELs, such as an array of VCSELs, may be used instead of an LED. The time period that the light source is turned on may fill the entire vblank or may be less than the duration of the vblank.

This may be accomplished by driving the illuminator in pulses, such as with a pulse width modulation, where the timing of the peak power of the pulses is each within the duration of one of the vblanks. The driving of the illuminator may be controlled by providing sync signals from the sensor (or camera) and in the form of sync parameters, and in turn, the timing of vblanks and/or integration periods as one example. The sync parameters may be used to sync the peak power pulses and/or a duty cycle with the sync signal. The details of the syncing are explained below.

By one form, the method comprises performing frame subtraction by lighting every other vblank with the illuminator to form alternating lit frames and alternating dark frames to form frame pairs without lost or corrupted frames from partial illumination. The dark frame can then be subtracted from the lit frame to efficiently remove ambient light made more efficient by the high light intensity brought by use of the VCSEL rather than the LED.

It will be appreciated that on the current frame such a synchronization between the illuminator and sensor may leave the beginning of some of the rows dark with these dark areas shrinking in duration the lower the row, and the end of some of the rows dark with these dark areas growing in duration the lower the row. This is inconsequential as long as the illuminator lights the rows all equally and by one example, within a window that substantially covers a region of interest on the resulting images. Since the middle of the frame is lit, it is assumed that for many applications, such as facial recognition, this is adequate. The details are explained below.

Process 400 also may include "sense the received light at the camera sensor to convert the light into image data to form the frames in the sequence of frames" 408, and particularly, where the collected photocharge is read and then digitized for example, to form raw image data, which is then processed to form frames for analysis and/or display as described herein.

Figure 5:
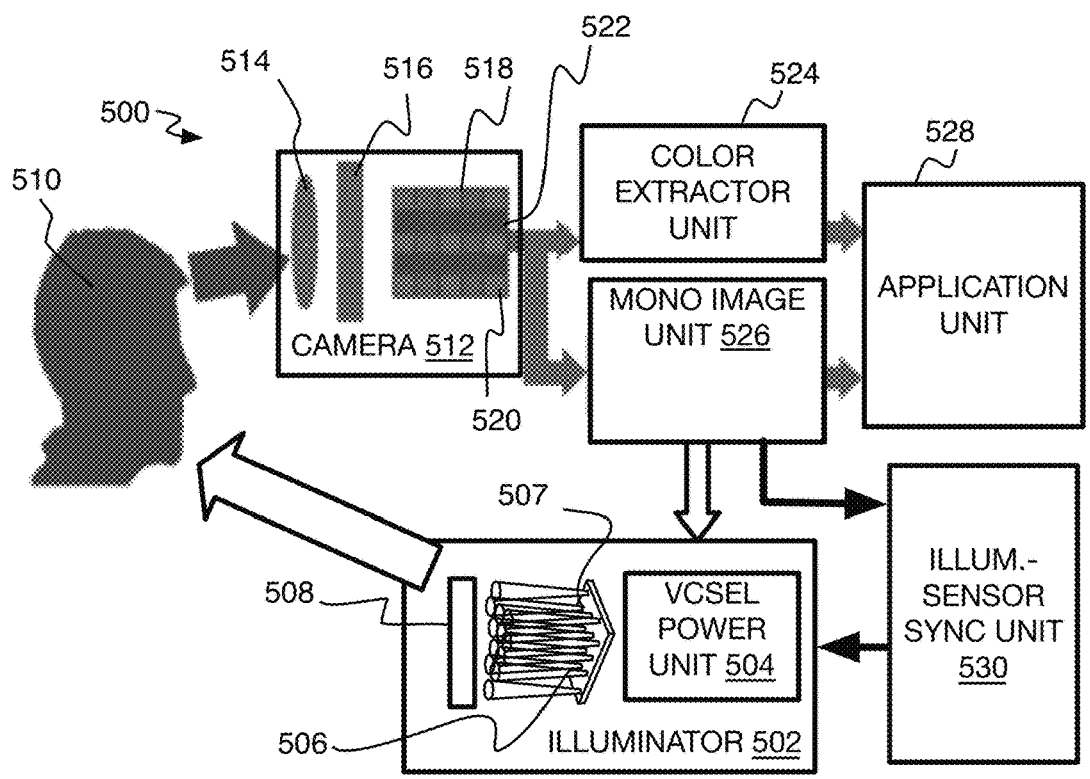
FIG. 5 is a schematic diagram of a VCSEL IR light projection and image capture and processing system.
Figure 9:
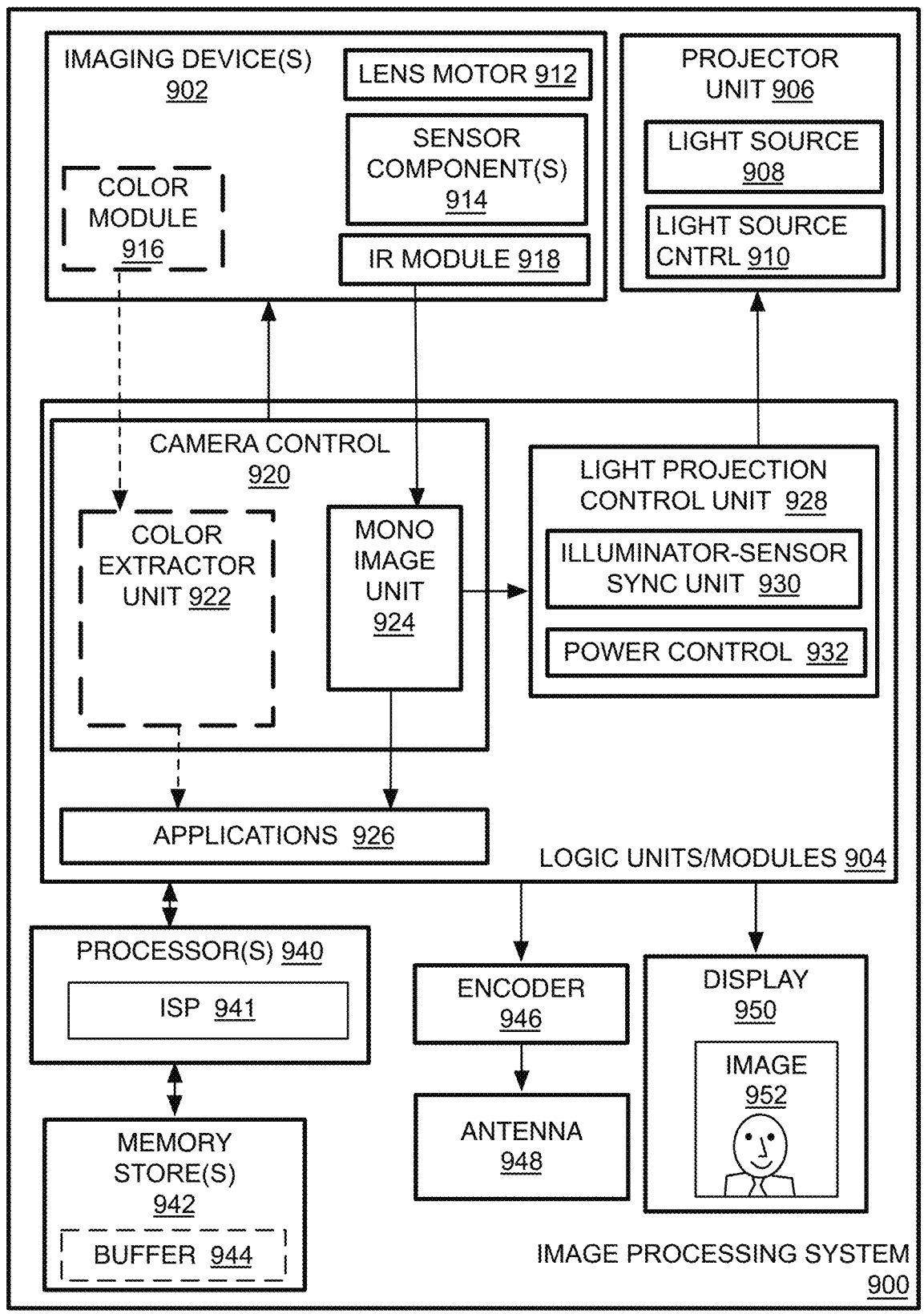
FIG. 9 is an illustrative diagram of an example image processing system

Referring to FIG. 5, an image capture and processing system (or just image processing system) 500 is similar to the image processing system 200 described above, and the components are numbered similarly so that duplicate descriptions are not necessary here, except that on system 500, the LED 206 and lens 208 has been replaced with a VCSEL 506 and diffuser 508. Also, an illuminator-sensor (I-S) sync unit 530 is provided to control the timing of the VCSEL illumination. The sync unit 530 may or may not be part of a light projection control unit 928 (FIG. 9). It will be appreciated that the I-S sync unit 530 could be considered part of the mono image unit 526 or illuminator 502 or both.

As mentioned above, the VCSEL 506 may be at least one VCSEL, and here an array 507 of VCSELS 506 are shown emitting light. The VCSEL may be used in order to narrow the band emission compared to the broad emission of an LED, thereby reducing wasted energy outside of the field of view of the resulting image (or outside a region of interest on the image) and the detrimental effect of ambient light at the sensor by permitting a narrower passband at a band pass filter. The VCSELs may or may not each have a metalayer that further shapes the light intensity distribution pattern or wavefront to provide more uniform light intensity and SNR over the image. The VCSEL array 507 also may be arranged to emit light with more than one wavelength in order to reduce speckle on resulting images. In other examples, the VCSEL may be a single VCSEL also with a diffuser.

While the mono image unit 526 receives monochromatic image data and metadata from the camera 512 for one or more images, it also may receive a sync signal indicating the timing of vblanks on the shutter sequence of the sensor 518. The mono image unit 526 or the I-S sync unit 530 may convert the sync signal into sync parameters. The I-S sync unit 530 receives, or generates, the sync parameters, and then converts those sync parameters into electrical signals to adjust the VCSEL power unit 504 to control the VCSEL light source 506 in sync with the vblanks. This may be implemented in one example by including a state machine that monitors the status of the video signals generated by the camera 512 and then inserts the VCSEL control pulses to coincide with the vertical blanking period of the sensor. Other details are provided below.

Figure 6:
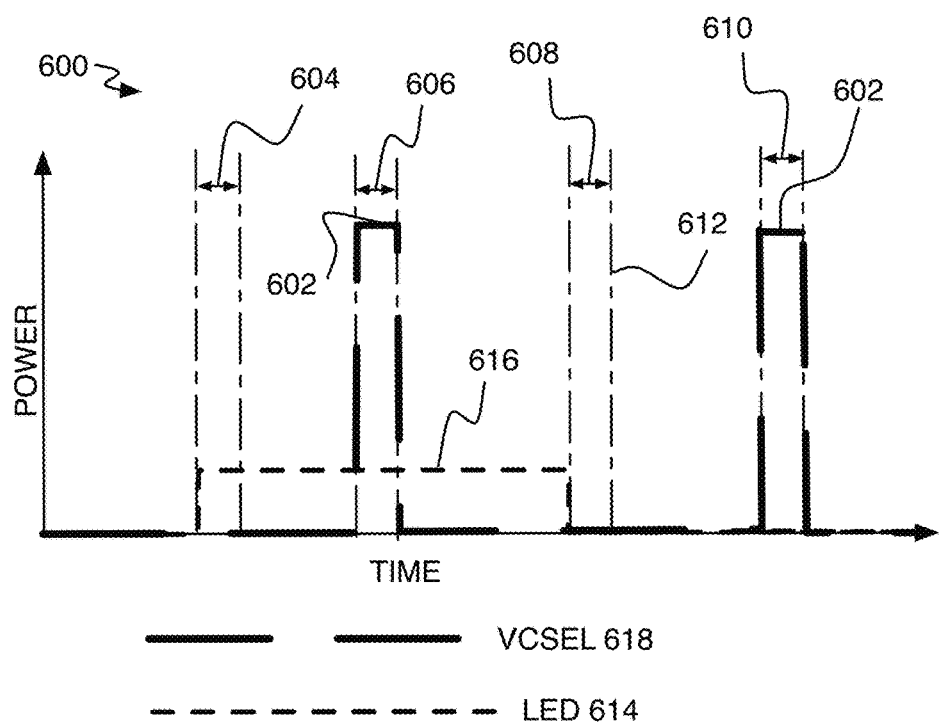
FIG. 6 is a power graph to operate an illuminator in accordance with at least one of the implementations herein.

Referring to FIG. 6, a power graph 600 shows the sequence for driving a VCSEL illuminator to synchronize power pulse peaks 602 with vblanks 604, 606, 608, and 610 of a shutter sequence 612 of the sensor. As shown, the LED signal 614 has a power peak 616 to turn the LED on at vblank 604 and keep it on until vblank 608 so that a sufficient amount of light energy may be collected on a frame (defined by the read-outs of the frame) between vblanks 606 and 608. The frames between the vblanks 604 and 606 as well as between 608 and 610 that receive partial light are corrupt since these frames needed to be entirely dark and the duration of the light is not the same on all of the frames. Thus, in addition to the benefits of improved SNR and efficiency that can be delivered using the VCSEL, and because the VCSEL can operate with a relatively higher peak power, and only needs to be lit for shorter durations, the VCSEL may be operated at much higher peak power given fixed thermal and battery life constraints. Also, the system may be operated at high peak power with short on/off switching times and limited to at or within the vblanks so that there are no lost (or corrupted frames). Here, the power signal 618 for the VCSEL, which may be provided as a pulse width modulation (PWM), shows a single power peak 602 at or limited to within vblank 604, although the power could be pulsed multiple times with multiple peaks in a single vblank.

By one form, the VCSEL power substantially rises and falls at the start and end of the vblank to substantially match the duration of the vblank, although other alternatives exist as long as the power of the VCSEL, and in turn illumination intensity and energy, is within the vblank and does not exist substantially outside of the vblank and where it can significantly affect the photocharge of other frames. With the VCSEL, then, the power can have a peak 602 at alternate vblanks 604 and 616, to perform frame subtraction without lost frames for example.

By one form, the pulses may be provided at a relatively higher peak power of about 2 watts, and may be held uniform at the peak for up to about 17 ms (as limited by the frame rate), and/or may use a 25% duty cycle for example. Many solutions exist that balance increasing the peak power of the VCSEL (to enable a shorter blank time) against a faster readout speed (to enable a longer vblank periods). Any solution which enables the sensor to be read out in less than a frame period (i.e. non zero vblank time) and an illuminator capable of delivering the required energy in the remaining time can deliver this function.

The VCSEL also may have a driving current with a driving solution for minimizing speckle as well. This may include varying the current levels and/or frequency of a current signal or pattern, such as a pulse width modulation pattern (PWM), so that a single VCSEL emits light with multiple dominant wavelengths in order to reduce speckle. This raising and lower of current level (or pulse amplitude) or changing of the pulse frequency (or pulse width, density, or duty cycle) may be combined with the synchronization of the pulses with vblanks at the sensor. Thus, multiple pulses of varying amplitude, frequency and duration may be fired during a single blanking period for the purpose of increasing wavelength diversity while ensuring all the energy is delivered to the target frame.

Referring to FIGS. 7 and 7A, a rolling shutter sequence 702 is shown for an image capture system 700, and is shown for frames N−1 (760), frame N (762), and frame N+1 (764) with integration rows 702a to 702n each corresponding to one or more pixel rows of a sensor. The definitions of the labels of the integrations and the shutter sequence itself is the same as that described with shutter sequence 302, and need not be described again. Here, however, a VCSEL power sequence 740 is shown synchronized to the shutter sequence 702 rather than an LED power sequence, and as mentioned above whereas an LED must be enabled for two full frame times (two full frame reads for all rows), the VCSEL here may be enabled only during a single vblank 722 and, due to the shorter duration, may be operated at much higher power given fixed thermal and battery life constraints.

In more detail, the shortened illumination pulse may be captured equally by all rows in frame N (762) at lit portions 712 of the rows in frame N. Furthermore, none of the rows exposed for frame N−1 (760) or frame N+1 (764) are affected by the VCSEL illumination. Thus, frames N−1 (760) and frame N+1 (764) have exposure rows 704 and 718 while the VSCEL is off 742 and 749 in VCSEL power sequence 740, and respectively so that these are completely dark (unlit) frames 760 and 764 collecting ambient light such that all frames are available as either a dark or lit frame without lost, corrupt frames. The dark frames also may be collecting light to form color images for hybrid RGB-IR sensor systems.

A latency period 744 and 748 may be provided between the VCSEL on and off periods and at locations and durations to provide a transition between on and off modes of the VCSEL and to better ensure the VCSEL is not lit during integration 704 and read periods 706 of adjacent previous frame N−1 (760), reset 708 and read 714 periods of the current frame N (762), and the resets 716 and integration periods 718 of the adjacent subsequent frame N+1 (764). Thus, the VCSEL is turned on in this example slightly after the last reset and not at the exact start of vblank 722.

Other alternatives for starting and ending the VCSEL illumination 712, however, could be used. In one case, the illumination may start at the start of the vblank at the end of the last reset of the previous frame and on the bottom integration row, and may end at the end of the vblank at the start of the first read period on the top row of the current frame. It will be understood that last reset of the previous frame refers to the last reset clearing the photocharge from the previous frame to start the integration of a current frame. Otherwise, the illumination and VCSEL "on" period 746 may be shorter than the vblank as long as the illumination is substantially limited to within the vblank by one from, or at least does not significantly affect (and light at the same time as) any read and reset periods and integration periods of either of the adjacent frames.

In some implementations, the vertical blanking period may be extended for a rolling shutter sensor by accelerating the speed of the readout and to accommodate a longer pulse from the VCSEL to collect a greater amount of energy and light intensity. While this may be perceived as restricting the selection of sensors, it is actually less restrictive than the conventional solution since using the sensor at half the current frame rate may enable extending the vertical blanking period by the full frame time of the older approach. For example, for the traditional sensor to deliver frame pairs at 15 fps, the sensor must generate illuminated/non-illuminated pairs at 30 fps, and to accommodate the lost frames it must be run at 60 fps. As a consequence, the sensor must be capable of reading out in 17 ms (full frame time at 60 fps); so if the output is operated at this speed while the sensor is run slower at 30 fps, now the vertical blanking interval can be extended to 17 ms (or half the frame time) without violating the maximum supported readout rate. In practice, the VCSEL pulse may be more narrow than this, so a wider variety of sensors are possible using the lighting sequences with the VCSEL as disclosed herein.

In addition to ensuring no light is wasted, lowering the frame rate also increases the available exposure time, which may improve the color image quality in low light by permitting the collection of a greater amount of light. Such low light improvements may be an important consideration in many RGB-IR imaging systems.

With the VCSEL lighting at every other vblank, an alternating frame sequence 701 (FIG. 7A) may be formed with no lost frames where dark or exposure frames 760, 764, 768, and 722 alternate with lit frames 762, 766, and 770. As mentioned, these frames may form frame pairs so that a dark frame may be subtracted from an adjacent lit frame to remove ambient light from a resulting frame.

It will be noted that some of the duration for each of the rows of the current frame N 762 are still dark. This includes dark portions 710 and 711. What is important here is that each row receive the same concurrent amount of light, and in turn, the same amount of light intensity and energy. This is accomplished by shortening the duration of the light, enabled by using a VCSEL with a high power peak of the VCSEL that also enables such a higher amount of energy that a high SNR can be established and ambient light can be removed sufficiently. Thus, it does not matter that these dark areas of the integration rows on the current frame N 762 are never lit by the illuminator.

Referring to FIG. 8, an example process 800 for illuminator-sensor synchronization to capture images, and for image processing, described herein is arranged in accordance with at least some implementations of the present disclosure. In the illustrated implementation, process 800 may include one or more operations, functions or actions as illustrated by one or more of operations 802 to 810 numbered evenly. By way of non-limiting example, process 800 will be described herein with reference to any of the example image capturing or processing systems described herein and where relevant.

Process 800 may include "generate a sequence of frames each associated with a captured image" 802, and as described above with operation 402 of process 400, may be performed for generating monochromatic images, such as IR or NIR images, for analysis such as for object detection, and/or to be displayed such as for night vision, and so forth.

Process 800 may include "operate an electronic shutter using vertical-blanks (vblanks) occurring between the last reset of a previous frame and a first read of a current frame consecutively after the previous frame of the sequence of frames" 804, and as already described above.

Process 800 may include "obtain a sensor sync signal" 806, and by one form, the sync signal may be associated with the start, end, or both or each vblank. The sync signal may comprise discrete logic signals from the sensor device, or the timing may be embedded in the video stream data. Such a sync signal may be obtained from the camera or sensor and obtained by a camera control for example. These components are described in more detail with system 900 below. The sync signal may be provided continuously as the sensor is operating. Otherwise, the camera control may calculate the timing of the vertical blank period based on the known timing it has programmed into the image sensor.

Process 800 may include "determine synchronization between the sync signal and at least when an illuminator should be turned on to provide light to the sensor within the vblanks" 808. Here, the sync signal is analyzed and it is determined how long after certain points on the signal, such as the start or end of a previous vblank, the illuminator should be turned on and off for a next vblank. This timing then may be provided in the form of control parameters. By another example, the control parameters may include an indication of integration time that will be used by a sensor for an upcoming frame collection for example. Control parameters may alternatively or additionally specify a projector emitter duty cycle or otherwise specify a frame roll rate. The control parameters may further specify a projector emitter peak power level that is to be used to illuminate the illuminator at the correct times as described herein.

Process 800 may include "control the illuminator to light according to the synchronization" 810. Thus, the sync parameters are formed by a camera control, a projector control, and/or a light source control on the light source itself, and any of these may use the sync parameters to make or set electrical signals to adjust the circuitry of the light source, here being one or more VCSELs or VCSEL arrays, to turn the illuminator on and off at the desired moments in time along the shutter sequence.

It will be appreciated that both the radiation intensity and duty cycle of an illuminator may be controlled based on various camera control parameters that have become well-developed for rolling shutter camera hardware modules (CMs). An exemplary control parameter is integration time, which may be determined according to an auto-exposure algorithm. Implementations herein therefore may be integrated synergistically with existing camera technology.

In addition, any one or more of the operations of the process in FIG. 4-5 or 7-8 may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more processor core(s) may undertake one or more of the operations of the example processes herein in response to program code and/or instructions or instruction sets conveyed to the processor by one or more computer or machine-readable media. In general, a machine-readable medium may convey software in the form of program code and/or instructions or instruction sets that may cause any of the devices and/or systems to perform as described herein. The machine or computer readable media may be a non-transitory article or medium, such as a non-transitory computer readable medium, and may be used with any of the examples mentioned above or other examples except that it does not include a transitory signal per se. It does include those elements other than a signal per se that may hold data temporarily in a "transitory" fashion such as RAM and so forth.

As used in any implementation described herein, the term "module" refers to any combination of software logic and/or firmware logic configured to provide the functionality described herein. The software may be embodied as a software package, code and/or instruction set, and/or firmware that stores instructions executed by programmable circuitry. The modules may, collectively or individually, be embodied for implementation as part of a larger system, for example, an integrated circuit (IC), system on-chip (SoC), and so forth.

As used in any implementation described herein, the term "logic unit" refers to any combination of firmware logic and/or hardware logic configured to provide the functionality described herein. The "hardware", as used in any implementation described herein, may include, for example, singly or in any combination, hardwired circuitry, programmable circuitry, state machine circuitry, and/or firmware that stores instructions executed by programmable circuitry. The logic units may, collectively or individually, be embodied as circuitry that forms part of a larger system, for example, an integrated circuit (IC), system on-chip (SoC), and so forth. For example, a logic unit may be embodied in logic circuitry for the implementation firmware or hardware of the systems discussed herein. Further, one of ordinary skill in the art will appreciate that operations performed by hardware and/or firmware may also utilize a portion of software to implement the functionality of the logic unit.

As used in any implementation described herein, the term "engine" and/or "component" may refer to a module or to a logic unit, as these terms are described above. Accordingly, the term "engine" and/or "component" may refer to any combination of software logic, firmware logic, and/or hardware logic configured to provide the functionality described herein. For example, one of ordinary skill in the art will appreciate that operations performed by hardware and/or firmware may alternatively be implemented via a software module, which may be embodied as a software package, code and/or instruction set, and also appreciate that a logic unit may also utilize a portion of software to implement its functionality.

Referring to FIG. 9, an example image processing system 900 is arranged in accordance with at least some implementations of the present disclosure. In various implementations, the example image processing system 900 may have one or more imaging devices 902 to form or receive captured image data, and a projector (or illuminator) unit 906 to emit light to be reflected from objects and captured by the imaging device 902. This can be implemented in various ways. Thus, in one form, the image processing system 900 may be a digital camera or other image capture device (such as a dedicated camera), and imaging device 902, in this case, may be the camera hardware and camera sensor software, module, or component 914, while the projector unit 906 includes the projector hardware such as a light source 908 which may be one or more VCSELs, such as one or more VCSEL arrays, and with or without a metalayer on each or individual VCSELs, and may have projector software, modules or components as well. In other examples, image processing device 900 may be a multi-purpose electronic device, such as on a smartphone or laptop for example, and may have an imaging device 902, that includes or may be a camera, and includes the projector unit 906. In either case, logic modules 904 may communicate remotely with, or otherwise may be communicatively coupled to, the imaging device 902 and projector unit 906 for further processing of the image data.

Also in either case, such technology may include a camera such as a digital camera system, a dedicated camera device, or an imaging phone, providing a video with a sequence of frames. This may include a light projection and camera system that performs face detection, iris detection, or detection of other parts on a person to authorize an action or access for that person. Such a system may be provided on a multi-purpose computing device for access to that device, files on that device, or access to other objects, or could be part of a dedicated access authorization system such as a door or safe lock. Other forms for the image processing device 900 may include a camera sensor-type imaging device or the like (for example, a webcam or webcam sensor or other CMOS sensor), with or without the use of a (RGB) depth camera and/or microphone-array to locate who is speaking. The camera sensor may support electronic shutters, such as a global shutter in addition to, or instead of, a rolling shutter as described above, or other rolling-type shutters. In other examples, an RGB-Depth camera may be used in addition to a camera sensor. In some cases, the camera may be an RGB-IR camera.

In one form, imaging device 902 may include camera hardware and optics including one or more sensors, such as a CMOS sensor, as well as auto-focus, zoom, aperture, ND-filter, auto-exposure, flash (if not provided by projector unit 906), and actuator controls. These controls may be part of the sensor module or component 914 for operating the sensor. The sensor component 914 may be part of the imaging device 902, or may be part of the logical modules 904 or both. Such sensor component can be used to generate images for a viewfinder and take still pictures or video. The sensor component 914 may be arranged to sense monochromatic (such as IR-related or NIR) light, RGB (or other color scheme, such as YUV) light, or both. The sensor component 914 may be controlled to operate a rolling shutter or electronic focal plane shutter process where pixels are read out progressively in a line-sequential fashion for a frame, as described elsewhere herein.

The imaging device 902 also may have a lens, an analog amplifier, an A/D converter, optionally a lens motor 912, optionally an RGB module 916, an IR module 918, and other components to convert incident light into a digital signal, the like, and/or combinations thereof. The RGB module 916 and the IR module 918 provide RGB and IR raw image data and metadata to the relevant logic units 904. The IR module 918 also may provide a sync signal indicating the state or point in an image sequence capturing process, such as with video, including indication of an electronic shutter state or timing, such as vblank times and/or integration times. The digital signal also may be referred to as the raw image data herein.

The projector unit 906 may have those components necessary to operate the VCSEL light source and metalayer, when present, to emit IR or NIR light. Thus, the projector unit 906 may include a light source control 910 with circuitry to control the amount of power and current fed to the light source 908 as well as the timing of the power, such as a peak power level and/or duty cycle when a pulse width modulation (PWM) scheme is applied to light only during certain frames, such as every other frame, and to turn the light source on and off for example. The projector unit 906 also may include other light sources, such as for a camera flash, or to provide additional or alternative types of monochromatic or other chromatic combination light than IR or NIR.

In the illustrated example, the logic modules 904 may include a camera control unit 920 that controls the image device 902 operations, and a light projection control unit 928 that controls the projector unit 906. The camera control unit 920 has an optional color extractor unit 922 and a mono image unit 924 that respectively receive the color and monochromatic data from the color module 916 and IR module 918. These two units, as described above with system 500, may perform pre-processing such as resolution reduction, Bayer demosaic, and/or vignette elimination, for example, and statistics gathering. The image data then may be provided to the applications 926 for further processing and analysis for the particular applications also as described above.

The mono image unit 924 also may use the received sync signal to generate sync parameters as described above with process 800. The sync parameters, which may be in digital form such as indicating one or more 0s or 1s in a register for example, are then provided to (or provided accessible to) an illuminator-sensor sync unit 930 at the light projection control unit 928. The sync unit 930 then may adjust settings at a power control 932 to reflect the values of the sync parameters. The power control 932 then may transmit electrical signals to a light source control 910 to turn the light source 908 on and off at the desired current levels according to the shutter timing as described above. There are number of different ways to convert the sync parameters to electronic commands to operate the light source control 910, and this may occur at many of the different components mentioned. Thus, by another example, the sync commands may be provided to the light source control 910 to convert the parameters into circuit settings to turn the light source on and off as desired and as described above. By one example mentioned above, this may include having the projector 906 operable in an illumination mode by turning the VCSEL both on and off during a single vblank, but only during vblanks of every other frame to perform frame subtraction.

The camera control unit 920 also may control the operations of the imaging device 902 and provide parameters and/or instructions for sensor and shutter operations as well as other camera settings such as those related to 3A (automatic white balance (AWB), automatic exposure control (AEC), and automatic focus (AF)) and other parameters.

The image processing system 900 may have one or more of processors 940 which may include a dedicated image signal processor (ISP) 941 such as the Intel Atom, memory stores 942 with RAM, cache, and/or other memory types, one or more displays 950, encoder 946, and antenna 948. In one example implementation, the image processing system 900 may have the display 950, at least one processor 940 communicatively coupled to the display, at least one memory 942 communicatively coupled to the processor, and having a buffer 944 by one example for storing image data and other data related to projector unit 906 and/or imaging device 902. The encoder 946 and antenna 948 may be provided to compress the image date for transmission to other devices that may display or store the image. It will be understood that the image processing system 900 may also include a decoder (or encoder 968 may include a decoder) to receive and decode image data for processing by the system 900. Otherwise, the processed image 952 may be displayed on display 950 or stored in memory 942. As illustrated, any of these components may be capable of communication with one another and/or communication with portions of logic modules 904, projector unit 906, and/or imaging device 902. Thus, processors 940 may be communicatively coupled to the imaging device 902, projector unit 906, and the logic modules 904 for operating those components. By one approach, although image processing system 900, as shown in FIG. 9, may include one particular set of blocks or actions associated with particular components, units, or modules, these blocks or actions may be associated with different components, units, or modules than the particular component, unit, or module illustrated here. Thus, it will be understood that units herein may be considered a part of the same unit or component due to the functions of those units and are not necessarily physically located together or considered the same part of coding that operates that component.

Referring to FIG. 10, an example system 1000 in accordance with the present disclosure operates one or more aspects of the image capture and/or processing systems described herein. It will be understood from the nature of the system components described below that such components may be associated with, or used to operate, certain part or parts of the image processing system described above. In various implementations, system 1000 may be a media system although system 1000 is not limited to this context. For example, system 1000 may be incorporated into a digital still camera, digital video camera, mobile device with camera or video functions such as an imaging phone, webcam, personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In various implementations, system 1000 includes a platform 1002 coupled to a display 1020. Platform 1002 may receive content from a content device such as content services device(s) 1030 or content delivery device(s) 1040 or other similar content sources. A navigation controller 1050 including one or more navigation features may be used to interact with, for example, platform 1002 and/or display 1020. Each of these components is described in greater detail below.

In various implementations, platform 1002 may include any combination of a camera 1004 and light projector 1006 as described above, chipset 1005, processor 1010, memory 1012, storage 1014, graphics subsystem 1015, applications 1016 and/or radio 1018. Chipset 1005 may provide intercommunication among processor 1010, memory 1012, storage 1014, graphics subsystem 1015, applications 1016 and/or radio 1018. For example, chipset 1005 may include a storage adapter (not depicted) capable of providing intercommunication with storage 1014.

Processor 1010 may be implemented as a Complex Instruction Set Computer (CISC) or Reduced Instruction Set Computer (RISC) processors; x86 instruction set compatible processors, multi-core, or any other microprocessor or central processing unit (CPU). In various implementations, processor 1010 may be dual-core processor(s), dual-core mobile processor(s), and so forth. Processor 1010 may include logic circuitry to generate a frame-based series of control parameters for synchronizing the camera 1004 and projector 1006 during shutter operations. In some implementations, one or more computer readable media may store instructions, which when executed by processor 1010, cause the processor to generate a frame-based series of control parameters for synchronizing camera 1004 and projector 1006 during shutter operations. One or more image frame exposed by camera 1004 using light projection determined by processor 1010 then may be stored in memory 1012.

Memory 1012 may be implemented as a volatile memory device such as, but not limited to, a Random Access Memory (RAM), Dynamic Random Access Memory (DRAM), or Static RAM (SRAM). Storage 1014 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In various implementations, storage 1014 may include technology to increase the storage performance enhanced protection for valuable digital media when multiple hard drives are included, for example.

Graphics subsystem 1015 may perform processing of images such as still or video for display. Graphics subsystem 1015 may be a graphics processing unit (GPU) or a visual processing unit (VPU), for example. An analog or digital interface may be used to communicatively couple graphics subsystem 1015 and display 1020. For example, the interface may be any of a High-Definition Multimedia Interface, Display Port, wireless HDMI, and/or wireless HD compliant techniques. Graphics subsystem 1015 may be integrated into processor 1010 or chipset 1005. In some implementations, graphics subsystem 1015 may be a stand-alone card communicatively coupled to chipset 1005.

The graphics and/or video processing techniques described herein may be implemented in various hardware architectures. For example, graphics and/or video functionality may be integrated within a chipset. Alternatively, a discrete graphics and/or video processor may be used. As still another implementation, the graphics and/or video functions may be provided by a general purpose processor, including a multi-core processor. In further embodiments, the functions may be implemented in a consumer electronics device.

Radio 1018 may include one or more radios capable of transmitting and receiving signals using various suitable wireless communications techniques. Such techniques may involve communications across one or more wireless networks. Example wireless networks include (but are not limited to) wireless local area networks (WLANs), wireless personal area networks (WPANs), wireless metropolitan area network (WMANs), cellular networks, and satellite networks. In communicating across such networks, radio 1018 may operate in accordance with one or more applicable standards in any version.

In various implementations, display 1020, which may be a human interface device (HID), may include any television type monitor or display. Display 1020 may include, for example, a computer display screen, touch screen display, video monitor, television-like device, and/or a television. Display 1020 may be digital and/or analog. In various implementations, display 1020 may be a holographic display. Also, display 1020 may be a transparent surface that may receive a visual projection. Such projections may convey various forms of information, images, and/or objects. For example, such projections may be a visual overlay for a mobile augmented reality (MAR) application. Under the control of one or more software applications 1016, platform 1002 may display user interface 1022 on display 1020, and platform 1002 may collect raw image data with camera 1006, which is processed and output to display 1020.

In various implementations, content services device(s) 1030 may be hosted by any national, international and/or independent service and thus accessible to platform 1002 via the Internet, for example. Content services device(s) 1030 may be coupled to platform 1002 and/or to display 1020. Platform 1002 and/or content services device(s) 1030 may be coupled to a network 1060 to communicate (e.g., send and/or receive) media information to and from network 1060. Content delivery device(s) 1040 also may be coupled to platform 1002 and/or to display 1020.

In various implementations, content services device(s) 1030 may include a cable television box, personal computer, network, telephone, Internet enabled devices or appliance capable of delivering digital information and/or content, and any other similar device capable of unidirectionally or bidirectionally communicating content between content providers and platform 1002 and/display 1020, via network 1060 or directly. It will be appreciated that the content may be communicated unidirectionally and/or bidirectionally to and from any one of the components in system 1000 and a content provider via network 1060. Examples of content may include any media information including, for example, video, music, medical and gaming information, and so forth.

Content services device(s) 1030 may receive content such as cable television programming including media information, digital information, and/or other content. Examples of content providers may include any cable or satellite television or radio or Internet content providers. The provided examples are not meant to limit implementations in accordance with the present disclosure in any way.

In various implementations, platform 1002 may receive control signals from navigation controller 1050 having one or more navigation features. The navigation features of controller 1050 may be used to interact with user interface 1022, for example. In embodiments, navigation controller 1050 may be a pointing device that may be a computer hardware component (specifically, a human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 1050 may be replicated on a display (e.g., display 1020) by movements of a pointer, cursor, focus ring, or other visual indicators displayed on the display. For example, under the control of software applications 1016, the navigation features located on navigation controller 1050 may be mapped to virtual navigation features displayed on user interface 1022, for example. In embodiments, controller 1050 may not be a separate component but may be integrated into platform 1002 and/or display 1020. The present disclosure, however, is not limited to the elements or in the context shown or described herein.

In various implementations, drivers (not shown) may include technology to enable users to instantly turn on and off platform 1002 like a television with the touch of a button after initial boot-up, when enabled, for example. Program logic may allow platform 1002 to stream content to media adaptors or other content services device(s) 1030 or content delivery device(s) 1040 even when the platform is turned "off." In addition, chipset 1005 may include hardware and/or software support for 8.1 surround sound audio and/or high definition (7.1) surround sound audio, for example. Drivers may include a graphics driver for integrated graphics platforms. In embodiments, the graphics driver may comprise a peripheral component interconnect (PCI) Express graphics card.

In various implementations, any one or more of the components shown in system 1000 may be integrated. For example, platform 1002 and content services device(s) 1030 may be integrated, or platform 1002 and content delivery device(s) 1040 may be integrated, or platform 1002, content services device(s) 1030, and content delivery device(s) 1040 may be integrated, for example. In various embodiments, platform 1002 and display 1020 may be an integrated unit. Display 1020 and content service device(s) 1030 may be integrated, or display 1020 and content delivery device(s) 1040 may be integrated, for example. These examples are not meant to limit the present disclosure.

In various embodiments, system 1000 may be implemented as a wireless system, a wired system, or a combination of both. When implemented as a wireless system, system 1000 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 1000 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

Platform 1002 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The implementations, however, are not limited to the elements or in the context shown or described in FIG. 10.

Figure 11:
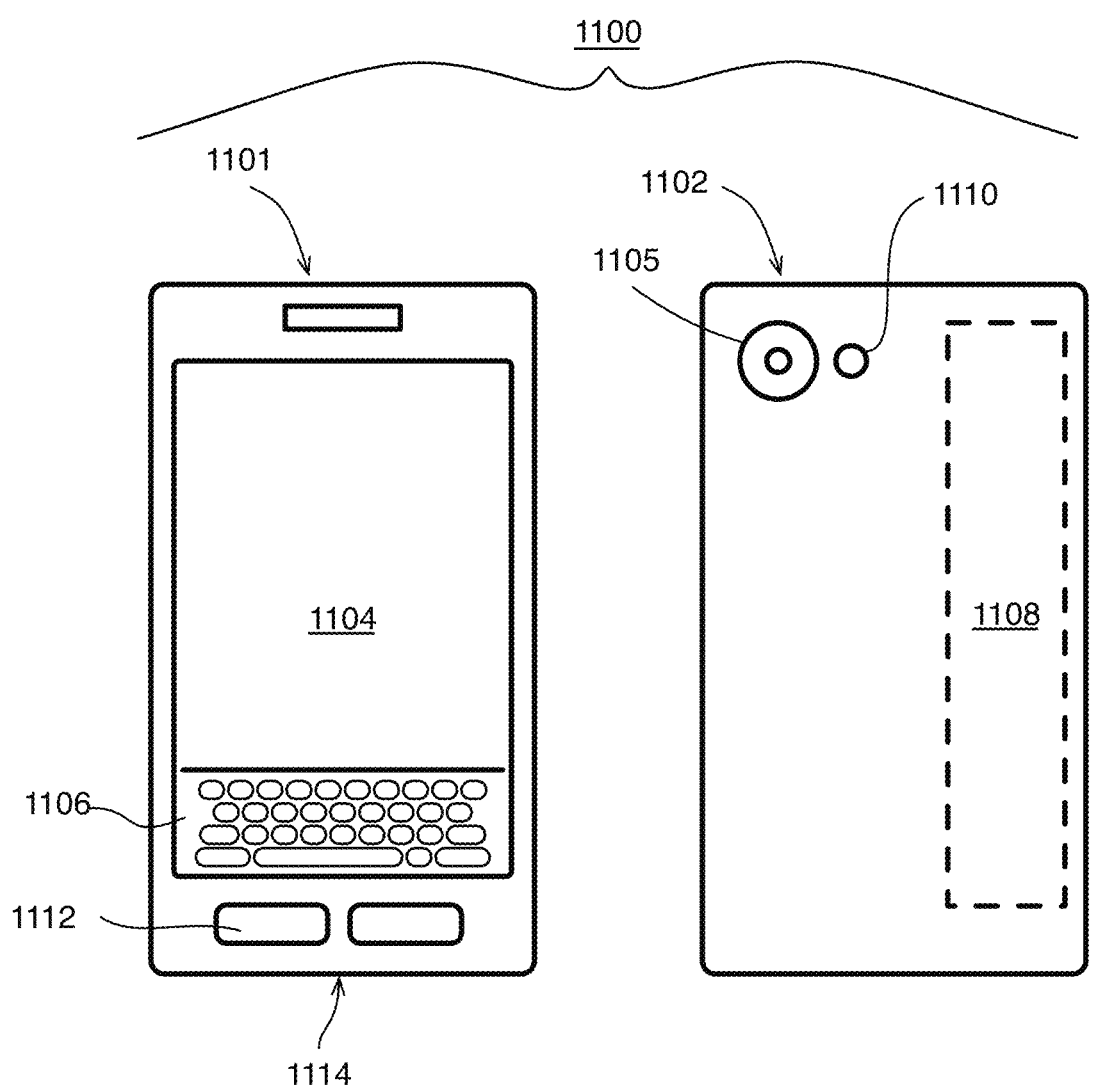
FIG. 11 is an illustrative diagram of an example system, all arranged in accordance with at least some implementations of the present disclosure.

Referring to FIG. 11, a small form factor device 1100 is one example of the varying physical styles or form factors in which systems 900 or 1000 may be embodied. By this approach, device 1100 may be implemented as a mobile computing device having wireless capabilities. A mobile computing device may refer to any device having a processing system and a mobile power source or supply, such as one or more batteries, for example.

As described above, examples of a mobile computing device may include a digital still camera, digital video camera, mobile devices with camera or video functions such as imaging phones, webcam, personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The implementations are not limited in this context.

As shown in FIG. 11, device 1100 may include a housing with a front 1101 and a back 1102. Device 1100 includes a display 1104, an input/output (I/O) device 1106, and an integrated antenna 1108. Device 1100 also may include navigation features 1112. I/O device 1106 may include any suitable I/O device for entering information into a mobile computing device. Examples for I/O device 1106 may include an alphanumeric keyboard, a numeric keypad, a touch pad, input keys, buttons, switches, microphones, speakers, voice recognition device and software, and so forth. Information also may be entered into device 1100 by way of microphone 1114, or may be digitized by a voice recognition device. As shown, device 1100 may include a camera 1105 (e.g., including at least one lens, aperture, and imaging sensor) and an illuminator 1110, such as those described herein, integrated into back 1102 (or elsewhere) of device 1100. The implementations are not limited in this context.

Various forms of the devices and processes described herein may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further implementations.

By one example, a method of illuminator-sensor synchronization to capture images comprises generating a sequence of frames each associated with a captured image and comprising: operating an electronic shutter using vertical-blanks (vblanks) occurring between the last reset of a previous frame and a first read of a current frame consecutively after the previous frame of the sequence of frames; receiving, by at least one camera sensor, from at least one infra-red-related illuminator and limited to a time within or equal to the vblanks so that the illuminator is turned on and off at the same vblank; and sensing the received light at the camera sensor to convert the light into image data to form the frames in the sequence of frames.

By another implementation, the method also comprises wherein the illuminator generates the light as infra-red light from at least one vertical-cavity surface emitting laser (VCSEL); wherein the vblanks are extended to start about at the end of the last reset of the previous frame and end at about the start of the first read of the current frame; wherein the vblanks extend about 17 ms for frames processed at about 30 frames-per-second using at least one vertical-cavity surface emitting laser (VCSEL) as a light source of the illuminator; the method comprising receiving light from the illuminator every other vblank to provide light to form every other frame in the sequence of frames; and performing frame subtraction comprising subtracting a dark frame from an adjacent lit frame to reduce ambient light; wherein light received from the illuminator provides the same amount of light for each of the rows in a frame; receiving light from the illuminator for a duration that either (1) substantially matches the duration of a vblank or (2) is receiving light from the illuminator for a duration that is less than the duration of a vblank, and repeated for individual vblanks, and comprising providing a sync signal indicating timing of vblanks to be used to sync the vblanks with the illumination of the illuminator.

By a further example, a method of illuminator-sensor synchronization to capture images, comprises emitting light from at least one infra-red-related illuminator to have the light collected to form a sequence of frames with each frame forming an image; and timing the light to emit from the illuminator within vertical-blanks (vblanks) occurring between a last reset of a previous frame to a first read of a current frame happening consecutively after the previous frame so that the illuminator is turned on and off at the same continuous vblank.

The method also may include wherein the illuminator generates the light from at least one vertical-cavity surface emitting laser (VCSEL); providing the power of the illuminator in pulses; and setting the duty cycle so that pulses provide one or more high peak current pulses during an individual vblank; sequencing the pulses so that individual vblanks receive light from the illuminator in one high peak pulse, wherein a pulse width is about 17 ms to substantially match a duration of the vblank and by using at least one vertical-cavity surface emitting laser (VCSEL) as a light source of the illuminator; and performing frame subtraction to reduce ambient light comprising turning on the illuminator every other vblank to provide light to form every other frame in the sequence of frames.

By yet another implementation, a system for capturing images comprises at least one IR or NIR illuminator to emit light; at least one image capture device to capture a frame sequence and having at least one sensor to collect light from the illuminator by using an electronic shutter using vertical-blanks (vblanks) occurring between the last reset of a previous frame and a first read of a current frame consecutively after the previous frame of the sequence of frames; at least one processor communicatively coupled to the at least one illuminator; at least one memory communicatively coupled to at least one processor; and an illuminator-sensor sync unit operated by the processor and to operate by setting the illuminator to emit light at a time within or equal to the vblanks so that the illuminator is turned on and off at the time of the same vblank, and wherein the at least one camera sensor receives the light within the vblanks and senses the received light to convert the light into image data to form the frames in the frame sequence.

By another example, the system further comprises wherein the illuminator comprises at least one vertical-cavity surface emitting laser (VCSEL) to provide the light as infra-red light; the illuminator being set to turn on every other frame in the sequence of frames to perform frame subtraction to reduce ambient light; a camera control to receive a sync signal from the at least one image capture device and provide sync parameters based on the sync signal, wherein the illuminator-sensor sync unit uses the sync parameters to control the illuminator; wherein the vblanks are extended to start about at the end of the last reset of the previous frame and end at about the start of the first read of the current frame; wherein the illuminator is powered to provide light in pulses, and has a duty cycle set so that pulses provide one or more high peak current pulses during an individual vblank; wherein the illuminator is arranged so that light is received in the same duration for each of the rows.

By a further example, an article having a non-transitory computer readable media comprising a plurality of instructions that in response to being executed on one or more processors, cause the processor(s) to operate by: generating a sequence of frames each associated with a captured image and comprising: operating an electronic shutter using vertical-blanks (vblanks) occurring between the last reset of a previous frame and a first read of a current frame consecutively after the previous frame of the sequence of frames; receiving, by at least one camera sensor, light from at least one infra-red-related illuminator and limited to a time within or equal to the vblanks so that the illuminator is turned on and off at the same vblank; and sensing the received light at the camera sensor to convert the light into image data to form the frames in the sequence of frames.

The instructions also may cause the processor(s) to operate by including wherein the illuminator generates the light as infra-red light from at least one vertical-cavity surface emitting laser (VCSEL); wherein the vblanks are extended to start about at the end of the last reset of the previous frame and end at about the start of the first read of the current frame; wherein the vblanks extend about 17 ms for frames processed at about 30 frames-per-second using at least one vertical-cavity surface emitting laser (VCSEL) as a light source of the illuminator; receiving light from the illuminator every other vblank to provide light to form every other frame in the sequence of frames; and performing frame subtraction comprising subtracting a dark frame from an adjacent lit frame to reduce ambient light; wherein light received from the illuminator provides the same amount of light for each of the rows in a frame; receiving light from the illuminator for a duration that substantially matches the duration of a vblank, and repeating for individual vblanks; receiving light from the illuminator for a duration that is less than the duration of a vblank, and repeating for individual vblanks; and comprising providing a sync signal indicating timing of vblanks to be used to sync the vblanks with the illumination of the illuminator.

In a further example, at least one machine readable medium may include a plurality of instructions that in response to being executed on a computing device, causes the computing device to perform the method according to any one of the above examples.

In a still further example, an apparatus may include means for performing the methods according to any one of the above examples.

The above examples may include specific combination of features. However, the above examples are not limited in this regard and, in various implementations, the above examples may include undertaking only a subset of such features, undertaking a different order of such features, undertaking a different combination of such features, and/or undertaking additional features than those features explicitly listed. For example, all features described with respect to any example methods herein may be implemented with respect to any example apparatus, example systems, and/or example articles, and vice versa.

What is claimed is:

1. A method of illuminator-sensor synchronization to capture images, comprising
    generating a sequence of frames each associated with a captured image and comprising:
        operating an electronic shutter using vertical-blanks (vblanks) occurring between the last reset of a previous frame and a first read of a current frame consecutively after the previous frame of the sequence of frames;
        receiving, by at least one camera sensor, from at least one infra-red-related illuminator and limited to a time within or equal to the vblanks so that the illuminator is turned on and off at the same vblank; and
        sensing the received light at the camera sensor to convert the light into image data to form the frames in the sequence of frames,
    wherein the illuminator generates the light as infra-red light from at least one vertical-cavity surface emitting laser (VCSEL),
    wherein a latency is inserted both between the last reset of the previous frame and the time the illuminator is turned on and the time the illuminator is turned off and the first read of the current frame.

2. The method of claim 1 wherein the vblanks are extended to start about at the end of the last reset of the previous frame and end at about the start of the first read of the current frame.

3. The method of claim 1 wherein the vblanks extend about 17 ms for frames processed at about 30 frames-per-second using at least one vertical-cavity surface emitting laser (VCSEL) as a light source of the illuminator.

4. The method of claim 1 comprising:
    receiving light from the illuminator every other vblank to provide light to form every other frame in the sequence of frames; and
    performing frame subtraction comprising subtracting a dark frame from an adjacent lit frame to reduce ambient light.

5. The method of claim 1 wherein light received from the illuminator provides the same amount of light for each of the rows in a frame.

6. The method of claim 1 comprising receiving light from the illuminator for a duration that matches the duration of a vblank, and repeated for individual vblanks.

7. The method of claim 1 comprising receiving light from the illuminator for a duration that is less than the duration of a vblank, and repeated for individual vblanks.

8. The method of claim 7 comprising providing a sync signal indicating timing of vblanks to be used to sync the vblanks with the illumination of the illuminator.

9. A method of illuminator-sensor synchronization to capture images, comprising:
    emitting light from at least one infra-red-related illuminator to have the light collected to form a sequence of frames with each frame forming an image; and
    timing the light to emit from the illuminator within vertical-blanks (vblanks) occurring between a last reset of a previous frame to a first read of a current frame happening consecutively after the previous frame so that the illuminator is turned on and off at the same continuous vblank,
    wherein the illuminator generates the light from at least one vertical-cavity surface emitting laser (VCSEL),
    wherein a latency is inserted both between the last reset of the previous frame and the time the illuminator is turned on and the time the illuminator is turned off and the first read of the current frame.

10. The method of claim 9 comprising providing the power of the illuminator in pulses; and setting the duty cycle so that pulses provide one or more high peak current pulses during an individual vblank.

11. The method of claim 10 comprising sequencing the pulses so that individual vblanks receive light from the illuminator in one high peak pulse.

12. The method of claim 10 wherein a pulse width is about 17 ms to match a duration of the vblank and by using at least one vertical-cavity surface emitting laser (VCSEL) as a light source of the illuminator.

13. The method of claim 9 comprising performing frame subtraction to reduce ambient light comprising turning on the illuminator every other vblank to provide light to form every other frame in the sequence of frames.

14. A system for capturing images, comprising:
    at least one IR or NIR illuminator to emit light;
    at least one image capture device to capture a frame sequence and having at least one sensor to collect light from the illuminator by using an electronic shutter using vertical-blanks (vblanks) occurring between the last reset of a previous frame and a first read of a current frame consecutively after the previous frame of the sequence of frames;
    at least one processor communicatively coupled to the at least one illuminator;
    at least one memory communicatively coupled to at least one processor; and an illuminator-sensor sync unit operated by the processor and to operate by setting the illuminator to emit light at a time within or equal to the vblanks so that the illuminator is turned on and off at the time of the same vblank, and wherein the at least one camera sensor receives the light within the vblanks and senses the received light to convert the light into image data to form the frames in the frame sequence, wherein the illuminator comprises at least one vertical-cavity surface emitting laser (VCSEL) to provide the light as infra-red light, wherein a latency is inserted both between the last reset of the previous frame and the time the illuminator is turned on and the time the illuminator is turned off and the first read of the current frame.

15. The system of claim 14 comprising the illuminator being set to turn on every other frame in the sequence of frames to perform frame subtraction to reduce ambient light.

16. The system of claim 14 comprising a camera control to receive a sync signal from the at least one image capture device and provide sync parameters based on the sync signal.

17. The system of claim 16 wherein the illuminator-sensor sync unit uses the sync parameters to control the illuminator.

18. The system of claim 14 wherein the vblanks are extended to start about at the end of the last reset of the previous frame and end at about the start of the first read of the current frame.

19. The system of claim 14 wherein the illuminator is powered to provide light in pulses, and has a duty cycle set so that pulses provide one or more high peak current pulses during an individual vblank.

20. The system of claim 14 wherein the illuminator is arranged so that light is received in the same duration for each of the rows.

21. An article having a non-transitory computer readable media comprising a plurality of instructions that in response to being executed on one or more processors, cause the processor(s) to operate by:

generating a sequence of frames each associated with a captured image and comprising:

operating an electronic shutter using vertical-blanks (vblanks) occurring between the last reset of a previous frame and a first read of a current frame consecutively after the previous frame of the sequence of frames;

receiving, by at least one camera sensor, light from at least one infra-red-related illuminator and limited to a time within or equal to the vblanks so that the illuminator is turned on and off at the same vblank; and sensing the received light at the camera sensor to convert the light into image data to form the frames in the sequence of frames, wherein the illuminator comprises a vertical cavity surface emitting laser (VCSEL) based light source;

wherein a latency is inserted both between the last reset of the previous frame and the time the illuminator is turned on and the time the illuminator is turned off and the first read of the current frame.

* * * * *